(12) United States Patent
Cheng

(10) Patent No.: US 9,142,274 B2
(45) Date of Patent: Sep. 22, 2015

(54) TRACKING FOR WRITE OPERATIONS OF MEMORY DEVICES

(75) Inventor: Hong-Chen Cheng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 418 days.

(21) Appl. No.: 13/361,047

(22) Filed: Jan. 30, 2012

(65) Prior Publication Data

US 2013/0194860 A1  Aug. 1, 2013

(51) Int. Cl.
*G11C 8/08* (2006.01)
*G11C 7/22* (2006.01)
*G11C 11/419* (2006.01)
*G11C 11/412* (2006.01)

(52) U.S. Cl.
CPC ... *G11C 8/08* (2013.01); *G11C 7/227* (2013.01); *G11C 11/419* (2013.01); *G11C 11/412* (2013.01)

(58) Field of Classification Search
CPC ...... G11C 11/419; G11C 8/08; G11C 11/412; G11C 11/413; G11C 7/14; G11C 7/22; G11C 7/227
USPC .............. 365/154, 189.16, 210.1, 194, 191, 365/230.06
See application file for complete search history.

(56) References Cited

U.S. PATENT DOCUMENTS

| | | | |
|---|---|---|---|
| 5,936,895 A | 8/1999 | Shirley | |
| 6,061,286 A * | 5/2000 | Baroni et al. | 365/203 |
| 6,128,237 A | 10/2000 | Shirley et al. | |
| 6,483,754 B1 * | 11/2002 | Agrawal | 365/189.04 |
| 6,618,309 B2 * | 9/2003 | DeMaris et al. | 365/207 |
| 7,376,032 B2 * | 5/2008 | Nguyen et al. | 365/210.1 |
| 7,848,174 B2 | 12/2010 | Cheng et al. | |
| 2003/0206448 A1 * | 11/2003 | Sung et al. | 365/189.07 |
| 2008/0037338 A1 * | 2/2008 | Chen et al. | 365/194 |
| 2008/0298143 A1 * | 12/2008 | Chen et al. | 365/194 |

OTHER PUBLICATIONS

"Nanometer SRAM Designs with Resilient Timing Tracking Schemes", Design Technology Center (DTC) National Tsing-Hua University, Hsinchu, Taiwan, Nov. 16, 2007, p. 1-45.

* cited by examiner

*Primary Examiner* — Douglas King
(74) *Attorney, Agent, or Firm* — Eschweiler & Associates, LLC

(57) ABSTRACT

Some aspects of the present disclosure relate to write tracking techniques for memory devices. In some embodiments, a memory device includes an array of SRAM cells, wherein each SRAM cell includes a pair of cross-coupled inverters having complimentary storage nodes, and a pair of access transistors that allow selective access to the complimentary storage nodes, respectively. To help ensure that wordline and bitline pulses are of sufficient length and intensity, one or more write tracking cells track a wordline tracking signal, which is representative of a wordline pulse applied to a wordline. In response to the wordline tracking signal, the write tracking cell internally generates a signal that models bitline loading, and provides an output tracking signal based on the wordline tracking and bitline loading signals. Bitline and/or wordline pulses can then be set based on the output tracking signal.

22 Claims, 2 Drawing Sheets

TRACKING FOR WRITE OPERATIONS OF MEMORY DEVICES

BACKGROUND

Memory devices have storage capacities that are strongly linked to Moore's law, which states that the number of transistors on integrated circuits doubles approximately every 18 months. Thus, memory devices are one particular class of devices whose density has grown incredibly quickly (e.g., exponentially) in recent decades.

DETAILED DESCRIPTION

Figure 1:
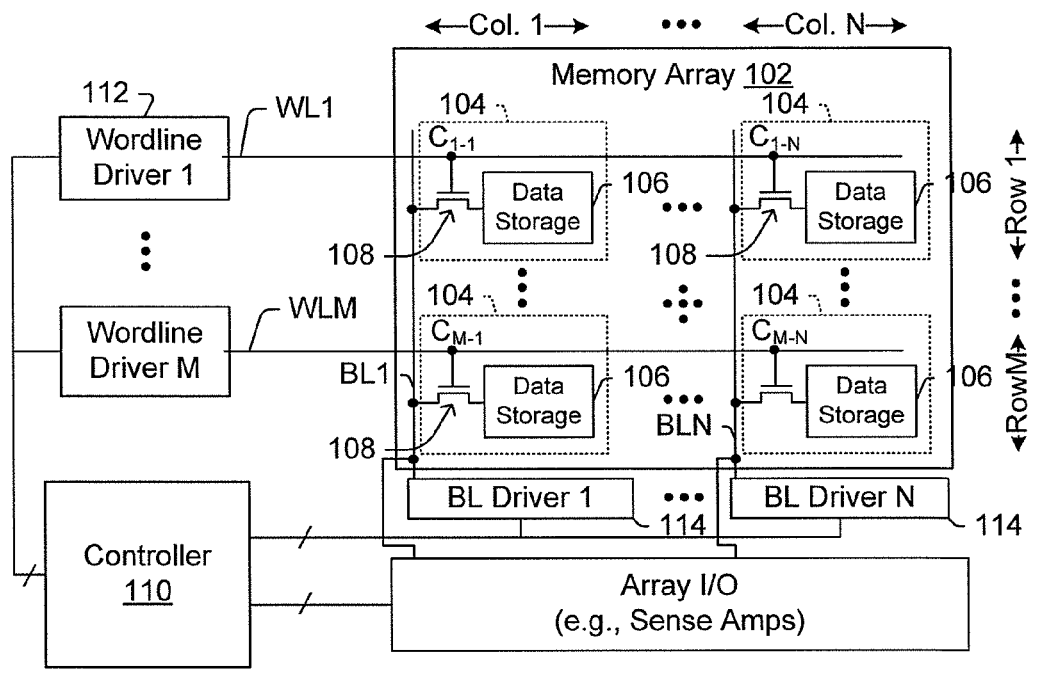
FIG. 1 is a block diagram of a memory device that suffers from some shortcomings.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. The claimed subject matter, however, may be practiced without these specific details.

FIG. 1 illustrates a memory device 100 that, as will be appreciated in more detail below, suffers from some shortcomings. The memory device 100 includes memory array 102 made up of memory cells 104. The memory cells 104 are arranged in M rows (words) and N columns (bits), wherein individual cells are labeled as $C_{ROW\text{-}COLUMN}$. Each memory cell 104 includes a data storage element 106 and at least one access transistor 108 that selectively allows access to the data storage element 106. Wordlines WL1, ..., WLM extend across respective rows of memory cells and are coupled to the gates of access transistors 108 for respective rows. Bitlines BL1, ..., BLN extend along columns of memory cells and are coupled to source/drain regions of the respective access transistors 108 of the columns.

To write data (e.g., a digital word) to a row of cells, a wordline is asserted to enable the access transistors 108 of the row. While the wordline is asserted, appropriate biases are applied to the bitlines to write respective values to the respective data storage elements 106 of the row. For example, to write a digital word of "1 ... 0" to the memory cells in Row1, controller 110 instructs WordlineDriver1 112 to pulse WL1 high, which enables NMOS access transistors 108 in the first row. The controller 110 concurrently instructs the bitline drivers 114 to bias BL1 with logical "1" (e.g., to write a "1" to $C_{1\text{-}1}$) and bias BLN with logical "0" (e.g., to write a "0" to $C_{1\text{-}N}$). Because WL1 activates the access transistors 108 in the first row, the bitline biases are applied to the data storage elements 106 in the first row and "flip" the data states stored in the respective data storage elements, if necessary. The other wordlines typically remain off such that data is written to only the accessed row, although multi-row writes can also occur in some implementations.

Although such a writing scheme is sufficient in many contexts, in some instances, the wordline and bitline pulses may be of insufficient length and/or intensity to "flip" the state of data stored in the data storage elements 106. This can occur in some cases when the device after fabrication exhibits timing and/or loading that deviates from what was designed. For example, in some SRAM process flows, the worst process corner for SRAM write operations is the slow-NMOS fast-PMOS corner, which makes it more difficult than expected to write "0" values into memory cells. Thus, when such memory devices are manufactured, some devices falling in the slow-NMOS fast PMOS corner of normal process variation may be less reliable than desired.

Figure 2:
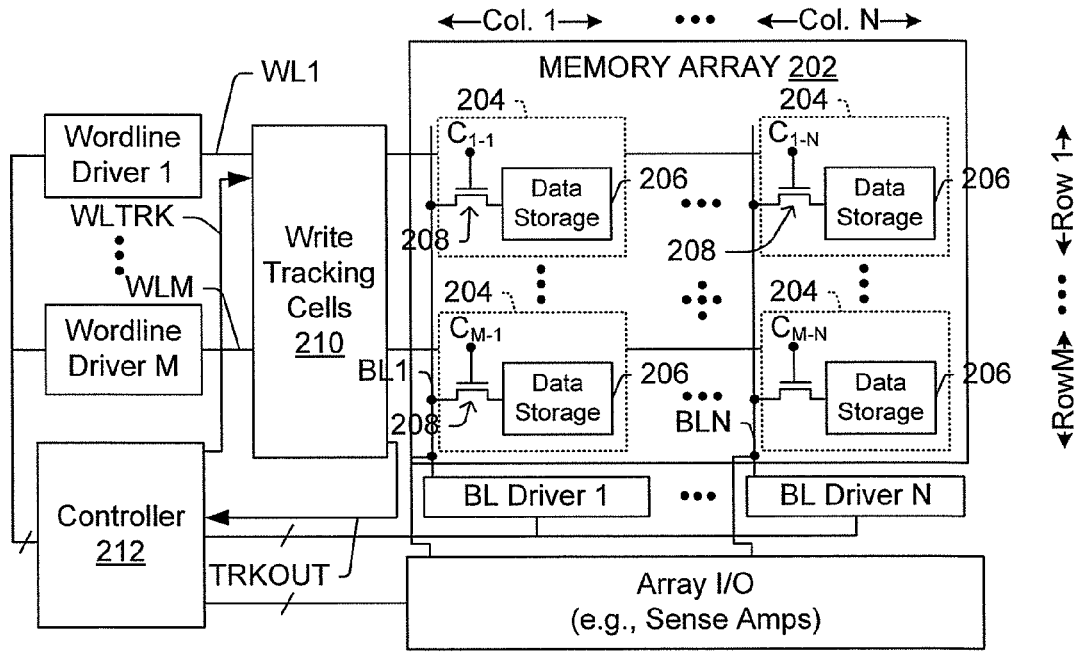
FIG. 2 is a block diagram of a memory device that makes use of write tracking techniques in accordance with some embodiments.

To limit these and/or other shortcomings, FIG. 2 shows a memory device 200 that makes use of write tracking techniques in accordance with some embodiments. Like FIG. 1's memory device 100, FIG. 2's memory device 200 includes a memory array 202 including N×M memory cells 204, wherein each memory cell 204 includes a data storage element 206 and at least one access transistor 208 that allows selective access to the data storage element 206. Wordlines (WL1 ... WLM) extend across respective rows of memory cells and bitlines (BL1 through BLN) extend along columns of memory cells, as shown. Each data storage element 206 has a transition time for the data storage element 206 to transition from a first data state to a second data state during a write operation. For example, this transition time corresponds to a transition from a high or logical "1" data state to a low or logical "0" data state, or vice versa.

To help ensure that wordline and bitline pulses are of sufficient length and intensity to successfully write data states to data storage elements 206, one or more write tracking cells 210 track a wordline tracking signal WLTRK, which is provided by controller 212 and which is representative of a wordline pulse applied to a wordline. Each write tracking cell 210 includes a transition modeling element that models the transition time of a data storage element 206. The controller 212 then measures the modeled transition time provided by the write tracking cell 210 in the form of a TRKOUT signal, and sets or adjusts the pulse lengths and/or intensities for the wordline and/or bitline pulses for write operations based on the measured modeled transition time. If, for example, the measured modeled transition time indicates the wordline and/or bitline pulses are too short, the controller 212 lengthens the wordline and/or bitline pulses to ensure data is correctly written to the memory cells 204 in an efficient manner. Conversely, if the wordline and/or bitline pulses are too long, the controller 212 shortens the pulses to help improve the data throughput of the memory device 200.

It will be appreciated that the controller 212 can be implemented in hardware, software, and/or combinations of hardware and software depending on the implementation. For example, in some embodiments, the controller 212 includes hardware circuitry, such as combinatorial logic and/or registers for example, which is dedicated to perform read and/or write operations for the memory. In other embodiments, the controller 212 includes a microcontroller or other circuits that flexibly controls the memory based on software and/or firmware instructions.

Figure 3:
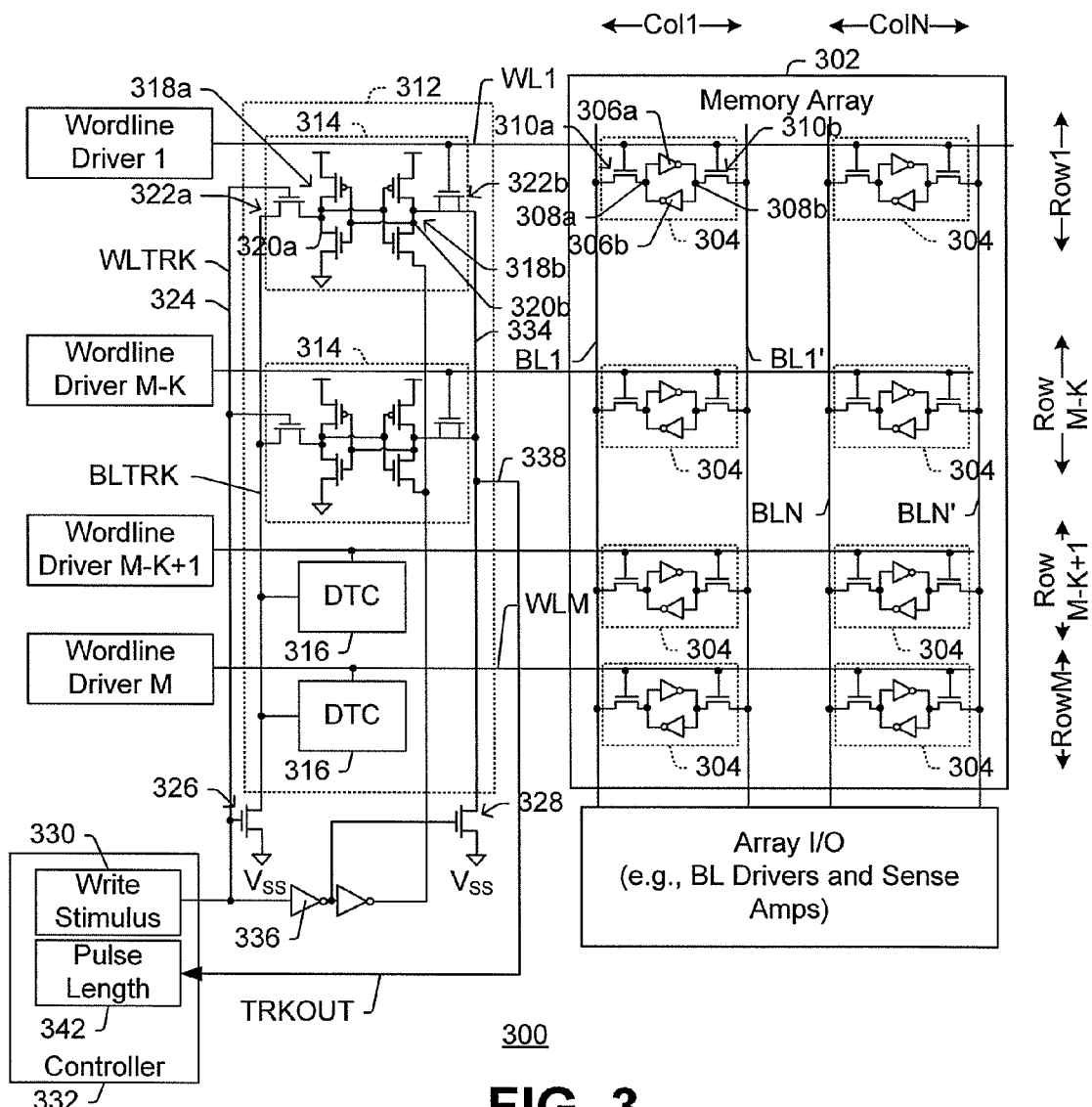
FIG. 3 is a block diagram of a memory device that makes use of write tracking techniques in accordance with some further embodiments.

FIG. 3 shows another embodiment of a memory device 300 that makes use of write tracking techniques in accordance with some embodiments. The memory device 300 includes memory array 302 made up of N×M SRAM cells 304. The SRAM cells 304 are arranged in M rows (words) and N columns (bits). Each SRAM cell 304 includes a pair of cross-coupled inverters having complimentary storage nodes, and a pair of access transistors that allow selective access to the complimentary storage nodes. For example, SRAM cell $C_{1-1}$ includes cross-coupled inverters 306a, 306b that define complimentary storage nodes 308a, 308b, which are accessible via access transistors 310a, 310b. Wordlines WL1, . . . , WLM extend across respective rows of memory cells and are coupled to the gates of access transistors for respective rows. Complimentary bitline pairs BL1/BL1', . . . , BLN/BLN' extend along columns of memory cells and are coupled to source/drain regions of the respective access transistors of the columns as shown. For example, a first complimentary bitline pair (BL1, BL1') is coupled to the source/drain regions of access transistors 310a, 310b of Col. 1.

In this example, a tracking column 312, which includes one or more write tracking cells 314 and one or more dummy tracking cells (DTC) 316, is arranged adjacent to the memory array 302. This embodiment shows M total rows, where K of these rows include write tracking cells 314 and the remainder of the rows include dummy tracking cells 316. It will be appreciated that M and K can be any positive integers, provided M is greater than or equal to K.

The write tracking cells 314 each include a transition modeling element in the form of first and second inverters that are cross-coupled to one another to define complimentary storage nodes. For example, write tracking cell 314 includes first and second cross-coupled inverters 318a, 318b having first and second complimentary storage nodes 320a, 320b, respectively. The write tracking cross-coupled inverters 318a, 318b are substantially matched to memory cell cross-coupled inverters 306a, 306b. For example, the lengths and widths and other device features of write tracking inverters 318a, 318b are designed to be substantially the same as that of memory cell inverters 306a, 306b. Some exemplary device features include doping concentrations, oxide thickness, capacitances, etc. This "matching" helps the write tracking cells 314 model timing and loading characteristics of memory cells 300 in the memory array 302.

The tracking cell 314 includes first and second access transistors 322a, 322b which are also substantially matched to the memory array access transistors 310a, 310b. The first access transistor(s) 322a has a gate coupled to a write stimulus module 330 in the controller 332. The first access transistor(s) 322a also has first source/drain region coupled to a tracking bitline BLTRK, which extends along the tracking column 312 and is coupled to the gate of transistor 326. The first access transistor 322a also has a second source/drain region coupled to the first complimentary storage node 320a.

The second access transistor(s) 322b has a gate coupled to a wordline WL1. The second access transistor(s) 322b also has a first source/drain region coupled to the second complimentary storage node 320b, and a second source/drain region coupled to a complimentary tracking bitline 334, which is coupled to the source/drain region of transistor 328. In the illustrated embodiment, the first and second source/drain regions of the second access transistor 322b are shorted together.

Prior to activating write tracking, the initial state of WLTRK is logical low or "0." As a result, the gate of transistor 328 coupled to the output of inverter 336 is logical high or "1", which turns on transistor 328 that pulls TRKOUT to voltage VSS at the source/drain region of transistor 328. Effectively, TRKOUT is logically low. To start write tracking, the write stimulus module 330 drives WLTRK high, which turns on transistor 326 and the first access transistor 322a, thereby pulling the first complimentary storage node 320a to supply voltage VSS at the source/drain region of transistor 326. At substantially the same time (notwithstanding delay through inverter 336), transistor 328 is turned off, such that the output node 338 and TRKOUT are no longer pulled low and are now driven by the second complimentary storage node 320b. Thus, activation of the wordline tracking signal WLTRK electrically couples the first complimentary storage node 320a to tracking bitline BLTRK and supply voltage VSS and substantially simultaneously disconnects the second complimentary storage node 320b from the supply voltage VSS, such that a tracking output signal TRKOUT is established on the output node 338 of the tracking column 312. Over time, the logical "0" on the tracking bitline BLTRK will be passed through the first access transistor 322a, thereby turning on PMOS transistor in the second inverter 318b and pulling TRKOUT to logical "1". The amount of time for this logical "0" to pass through the write tracking cell corresponds to the write time for data to be written to a memory cell in the memory array. For this reason, a pulse length module 342 in controller 332 then sets the pulse lengths applied to the bitlines and/or wordlines of the memory array 302 based on the TRKOUT signal, and/or a delay measured between the assertion of the WLTRK signal and the TRKOUT signal.

Figure 4:
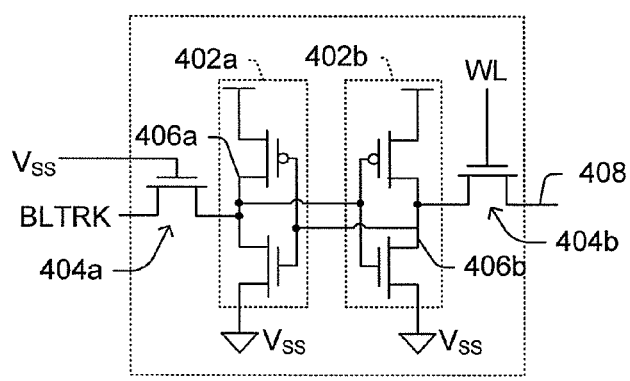
FIG. 4 is a block diagram of a dummy tracking cell in accordance with some embodiments.

FIG. 4 shows an example of a dummy tracking cell 400 that is used as a dummy tracking cell 306 in FIG. 3 in accordance with some embodiments. The dummy tracking cell 400 includes a pair of cross-coupled inverters 402a, 402b, which are substantially matched to memory cell cross-coupled inverters (e.g., 306a, 306b in FIG. 3). A pair of dummy access transistors 404a, 404b has source/drain regions coupled to complimentary storage nodes 406a, 406b of the cross-coupled inverters. The first access transistor 404a has its other source/drain coupled to the tracking bitline BLTRK. The other source/drain 408 of the second access transistor 404b is floating. In this way, the dummy tracking cells 400 model memory cells which are un-accessed in the memory array, and help to establish corresponding capacitance for the tracking bitline 314. This helps the tracking column 312 to provide highly advantageous write tracking.

Thus, some embodiments relate to memory devices. In one embodiment, a memory device includes a memory array made up of a plurality of memory cells including respective data storage elements. A data storage element of a memory cell has a transition time for the data storage element to transition from a first data state to a second data state during a write operation. A transition modeling element in the memory device models the transition time of the data storage element. A controller measures the modeled transition time provided by the write tracking cell and set a pulse length applied to the memory cell during the write operation based on the measured modeled transition time.

In another embodiment, a memory device includes a memory array including a plurality of static random access memory (SRAM) cells arranged in rows and columns. Wordlines are coupled to SRAM cells along respective rows and complimentary bitline pairs are coupled to SRAM cells along respective columns. A write tracking column includes one or more write tracking cells and a tracking bitline extending along the tracking column. A write tracking cell includes a pair of cross-coupled inverters having complimentary storage nodes, wherein a first complimentary storage node is coupled to the tracking bitline via a first access transistor, and a second complimentary storage node is coupled to an output node of the write tracking column.

Another embodiment relates to a write tracking circuit for a memory device. The write tracking circuit includes first and second inverters cross coupled to one another and having first and second complimentary storage nodes respectively associated therewith. First and second access transistors are coupled to the first and second complimentary storage nodes, respectively. A write stimulus module provides a wordline tracking signal to a gate of the first access transistor to selectively couple the first complimentary storage node to a supply voltage, and to substantially simultaneously disconnect the second complimentary storage node from the supply voltage to develop a tracking output signal on the second complimentary storage node. A pulse length module sets a pulse length for a write operation to a memory cell in a memory array based on the tracking output signal.

Although the disclosure has been shown and described with respect to one or more implementations, equivalent alterations and modifications will occur to a person of ordinary skill in the art based upon a reading and understanding of this specification and the annexed drawings. For example, although the illustrated wordline tracking techniques may utilize particular arrangements of p-type and n-type transistors in the illustrated embodiments, the polarity of these transistors can be switched in other embodiments along with a corresponding change in bias. Also, although the illustrated embodiments show SRAM cells with six transistors, which may also be referred to as 6T SRAM cells, other memory cells or SRAM cells with more or fewer than six transistors can also be used in other implementations. In these other embodiments, the write tracking cells will often mirror the structural arrangement of the SRAM cells to provide for more accurate modeling or "matching" between the actual SRAM cells and the tracking cells.

Further, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A memory device, comprising:
    a memory array including a plurality of memory cells including respective data storage elements, wherein a data storage element of a memory cell has a transition time for the data storage element to transition from a first data state to a second data state during a write operation;
    a write tracking cell including a transition modeling element that models the transition time of the data storage element, wherein the transition modeling element comprises: a pair of cross-coupled inverters having complimentary storage nodes, wherein a first complimentary storage node is coupled to an input node of the write tracking cell via a first access transistor, and a second complimentary storage node is coupled to an output node of the write tracking cell via a second access transistor whose source/drain regions are shorted together; and
    a controller configured to measure the modeled transition time provided by the write tracking cell and further configured to set a pulse length applied to the memory cell during the write operation based on the measured modeled transition time.

2. The memory device of claim 1, wherein the data storage element comprises:
    a pair of complimentary storage nodes to cooperatively store a data state in the data storage element.

3. The memory device of claim 2, further comprising:
    a pair of complimentary bitlines coupled the pair of complimentary storage nodes, respectively;
    wherein the controller is configured to set a pulse length applied to at least one bitline of the pair of complimentary bitlines based on the measured modeled transition time.

4. The memory device of claim 2, wherein the memory cell further comprises:
    a pair of access transistors that allow selective access to the pair of complimentary storage nodes, respectively; and
    a wordline coupled to respective gates of the pair of access transistors.

5. The memory device of claim 4, wherein the controller is configured to set a pulse length applied to the wordline based on the measured modeled transition time.

6. The memory device of claim 1, wherein the transition modeling element substantially matches the data storage element of the memory cell.

7. The memory device of claim 6, wherein the transition modeling element and data storage element each comprise a pair of cross-coupled inverters.

8. A memory device, comprising:
    a memory array including a plurality of static random access memory (SRAM) cells arranged in rows and columns, wherein wordlines are coupled to SRAM cells along respective rows and complimentary bitline pairs are coupled to SRAM cells along respective columns;
    a write tracking column including one or more write tracking cells and a tracking bitline extending along the write tracking column, wherein a write tracking cell comprises:
    a pair of cross-coupled inverters having complimentary storage nodes, wherein a first complimentary storage node is coupled to the tracking bitline via a first access transistor, and a second complimentary storage node is coupled to an output node of the write tracking column; and
    an electrical path by which a wordline tracking signal is provided to a supply terminal of one of the cross-coupled inverters.

9. The memory device of claim 8, further comprising:
    a controller configured to provide the wordline tracking signal to a gate of the first access transistor to selectively couple the first storage node to a supply voltage and to concurrently decouple the output node from the supply voltage to establish an output tracking signal from the write tracking column.

10. The memory device of claim 9, wherein the controller is configured to measure a transition time based on a delay between an edge of the wordline tracking signal and an edge of the output tracking signal.

11. The memory device of claim 10, wherein the measured transition time corresponds to a transition time to write data to a pair of cross-coupled inverters in an SRAM cell of the memory array.

12. The memory device of claim 8, wherein the tracking column comprises:
   a plurality of write tracking cells; and
   a plurality of dummy tracking cells that are different from the plurality of write tracking cells.

13. The memory device of claim 12, wherein a dummy tracking cell comprises:
   a pair of cross-coupled inverters having complimentary storage nodes;
   a pair of access transistors that allow access to the respective complimentary storage nodes.

14. The memory device of claim 13, wherein a source/drain region of a first access transistor of the pair of access transistors in the dummy tracking cell is coupled to the tracking bitline.

15. The memory device of claim 13, wherein a gate of the first access transistor of the pair of access transistors in the dummy tracking cell is continuously coupled to a supply voltage to put the first access transistor in a high resistance state.

16. A write tracking circuit for a memory device, comprising:
   first and second inverters cross coupled to one another and having first and second complimentary storage nodes respectively associated therewith;
   first and second access transistors coupled to the first and second complimentary storage nodes, respectively;
   a write stimulus module to provide a wordline tracking signal to a gate of the first access transistor to selectively couple the first complimentary storage node to a supply voltage, and to substantially simultaneously disconnect the second complimentary storage node from the supply voltage to develop a tracking output signal on the second complimentary storage node;
   a pulse length module to set a pulse length for a write operation to a memory cell in a memory array based on the tracking output signal;
   wherein the second access transistor has source/drain regions that are electrically shorted together.

17. The write tracking circuit of claim 16, wherein the shorted source/drain regions of the second access transistor provide the tracking output signal to the pulse length module.

18. The write tracking circuit of claim 16, further comprising:
   a wordline coupled to a gate of the first access transistor and also coupled to respective gates of respective access transistors in a row of memory cells in the memory array.

19. The write tracking circuit of claim 16, wherein the pulse length module is configured to set a bitline pulse length applied to a bitline of the memory cell in the memory array based on the tracking output signal.

20. The write tracking circuit of claim 16, wherein the pulse length module is configured to set a wordline pulse length applied to a wordline of the memory cell in the memory array based on the tracking output signal.

21. A memory device including a write tracking cell, the write tracking cell comprising:
   a pair of cross-coupled inverters having first and second complimentary storage nodes;
   a first access transistor having a first source/drain coupled to an input node of the write tracking cell, a second source/drain region coupled to the first complimentary storage node, and a gate terminal coupled to a controller, wherein the controller is configured to provide a wordline tracking signal to the gate terminal of the first access transistor;
   a second access transistor having a third source/drain coupled to the second complimentary storage node, a fourth source/drain region coupled to an output node of the write tracking cell, and a gate terminal coupled to a wordline driver, wherein the wordline driver is configured to provide a wordline signal to the gate terminal of the second access transistor, wherein the wordline signal is adjusted based on the wordline tracking cell receiving the wordline tracking signal; and
   an electrical path by which the wordline tracking signal is provided to a supply terminal of one of the cross-coupled inverters of the write tracking cell.

22. The memory device of claim 21, further comprising:
   a memory array including a plurality of memory cells arranged in rows and columns; wherein in addition to the wordline signal being provided to the gate terminal of the second access transistor, the wordline signal is also provided to gate terminals of access transistors of memory cells along a row of the memory array.

* * * * *